(12) United States Patent
Goddard et al.

(10) Patent No.: US 7,787,830 B2
(45) Date of Patent: Aug. 31, 2010

(54) TRANSCEIVER AND METHOD OF OPERATING AN ELECTRICAL CIRCUIT

(75) Inventors: Simon P. Goddard, Sheffield (GB); Kim Li, Sheffield (GB)

(73) Assignee: Jennic Limited, Sheffield (GB)

( * ) Notice: Subject to any disclaimer, the term of this patent is extended or adjusted under 35 U.S.C. 154(b) by 1044 days.

(21) Appl. No.: 11/444,148

(22) Filed: May 30, 2006

(65) Prior Publication Data

US 2007/0279099 A1 Dec. 6, 2007

(51) Int. Cl.
*H04B 1/44* (2006.01)

(52) U.S. Cl. ............................. 455/78; 455/76; 455/83; 455/80; 455/281; 455/292; 455/326; 455/343.5; 455/232.1; 455/253.2; 330/252; 330/253; 326/86; 375/219

(58) Field of Classification Search .................... 455/78, 455/76, 343.5, 326, 86, 254, 234.1, 232.1, 455/253.2, 83, 80, 281, 292, 293; 331/16; 330/253, 252; 326/86; 375/219
See application file for complete search history.

(56) References Cited

U.S. PATENT DOCUMENTS

| | | | | | |
|---|---|---|---|---|---|
| 5,448,772 | A | * | 9/1995 | Grandfield | 455/333 |
| 5,578,944 | A | * | 11/1996 | Sasaki | 326/86 |
| 5,767,726 | A | * | 6/1998 | Wang | 327/356 |
| 5,867,778 | A | * | 2/1999 | Khoury et al. | 455/321 |
| 5,991,605 | A | * | 11/1999 | Rapeli | 455/76 |
| 6,073,002 | A | * | 6/2000 | Peterson | 455/326 |
| 6,163,706 | A | * | 12/2000 | Rozenblit et al. | 455/522 |
| 6,226,276 | B1 | * | 5/2001 | Na | 370/294 |
| 6,278,872 | B1 | * | 8/2001 | Poulin et al. | 455/333 |
| 6,295,323 | B1 | * | 9/2001 | Gabara | 375/257 |
| 6,807,407 | B2 | * | 10/2004 | Ji | 455/326 |
| 6,870,399 | B2 | * | 3/2005 | Ngo et al. | 326/82 |
| 6,892,062 | B2 | * | 5/2005 | Lee et al. | 455/326 |
| 6,912,381 | B2 | * | 6/2005 | Murtojarvi | 455/296 |
| 6,999,743 | B2 | * | 2/2006 | Sabouri et al. | 455/307 |
| 7,013,118 | B2 | * | 3/2006 | Darabi et al. | 455/240.1 |
| 7,068,104 | B2 | * | 6/2006 | Burns et al. | 330/253 |
| 7,135,928 | B2 | * | 11/2006 | Behzad | 330/261 |
| 7,170,465 | B2 | * | 1/2007 | Rofougaran | 343/850 |
| 7,212,627 | B2 | * | 5/2007 | Choksi | 379/390.04 |
| 7,215,940 | B2 | * | 5/2007 | Goddard et al. | 455/326 |
| 7,269,391 | B2 | * | 9/2007 | Chiu et al. | 455/83 |
| 7,276,970 | B2 | * | 10/2007 | Khorramabadi | 330/253 |
| 7,283,793 | B1 | * | 10/2007 | McKay | 455/83 |
| 7,365,602 | B2 | * | 4/2008 | Bhatti et al. | 330/295 |
| 7,392,028 | B2 | * | 6/2008 | Goddard | 455/234.1 |
| 7,463,868 | B2 | * | 12/2008 | Rofougaran et al. | 455/118 |
| 7,558,556 | B1 | * | 7/2009 | Moloudi et al. | 455/323 |

* cited by examiner

*Primary Examiner*—Marceau Milord
(74) *Attorney, Agent, or Firm*—Wilmer Cutler Pickering Hale & Dorr LLP.

(57) ABSTRACT

There is provided a transceiver comprising a first node for receiving a received signal and transmitting a transmitted signal; a receiver, connected between a first voltage and the first node, for processing the received signal; a transmitter, connected between a second voltage and the first node, for generating the transmitted signal; and a DC voltage controller for selecting a DC component of a voltage of the first node to at least one of: selectively activate at least one of the transmitter and the receiver; and selectively substantially deactivate at least one of the transmitter and receiver.

20 Claims, 5 Drawing Sheets

500

TRANSCEIVER AND METHOD OF OPERATING AN ELECTRICAL CIRCUIT

FIELD OF THE INVENTION

Embodiments of the present invention relate to a transceiver, and method of operating an electrical circuit.

BACKGROUND TO THE INVENTION

For certain communications protocols, a transceiver only transmits or receives at any given time, and does not transmit and receive simultaneously. This allows a chip incorporating the transceiver to use two differential pins for both receiving a received signal and providing a signal to be transmitted. This reduces the pin count compared to chips that have separate pairs of differential pins for the received signal and the signal to be transmitted. The pins are therefore used for both input and output.

It is necessary in the transceiver to switch from a receive mode to a transmit mode and vice versa. In the receive mode, the transceiver processes the received signal using a receiver. A transmitter in the transceiver does not produce a signal to be transmitted. In the transmit mode, the transmitter produces a signal to be transmitted, and the receiver does not process the received signal.

The transceiver is typically implemented with switches in the signal path of the transmitter and the receiver. The switches connect the input/output pins to either the transmitter or the receiver, depending on the mode (transmit or receive) of the transceiver. The switches are therefore connected in series between the pins and the input nodes of the transmitter and the receiver.

As the switches are connected in series with the transmitter and the receiver, the switches introduce extra resistances that degrade the noise performance of the transceiver. For example, the extra resistances degrade noise performance of the receiver, and/or increase losses for the transmitter.

It is an object of embodiments of the invention at least to mitigate at least some of the problems associated with the prior art.

SUMMARY OF THE INVENTION

According to a first aspect of embodiments of the invention, there is provided a transceiver comprising: a first node for receiving a received signal and transmitting a transmitted signal; a receiver, connected between a first voltage and the first node, for processing the received signal; a transmitter, connected between a second voltage and the first node, for generating the transmitted signal; and a DC voltage controller for at least one of: selectively activating at least one of the transmitter and the receiver; and selectively substantially deactivating at least one of the transmitter and receiver.

Thus, a transceiver can be switched from transmit mode to a receive mode, and vice versa, without a switch being present in the signal path of the transmitter or receiver parts of the transmitter. A deactivated or substantially deactivated receiver or transmitter may consume little or no power compared to the activated equivalent, and/or produce little or no signal at its outputs.

Embodiments of the transceiver can share pins on an integrated circuit for both transmitting and receiving. Therefore, for a differential transceiver containing a differential transmitter and/or a differential receiver, a pair of differential pins can be used for both transmitting and receiving. The pair of pins can be connected to, for example, a differential antenna or a balun with a single-ended antenna.

In certain embodiments, the receiver is a differential receiver, the transceiver is a differential transceiver, and the first node is a differential node. A differential node is a pair of circuit nodes that carry a differential signal. Each of the pair of circuit nodes carries a voltage (such as, for example, a DC offset voltage, or DC component) that is displaced by a signal in substantially equal and opposite amounts. Thus one of the pair of circuit nodes can carry a voltage that is not simply equal in magnitude and opposite in polarity to the voltage carried by the other of the pair of circuit nodes, as the pair of circuit nodes can both carry, for example, the same DC offset value or DC component.

In certain embodiments, a balun is connected across the first node. In other words, the balun is connected to the pair of circuit nodes comprising the differential first node.

In certain embodiments, the DC voltage controller comprises a centre tap voltage controller for selecting a centre tap voltage for a centre tap of the balun. The centre tap voltage is thus chosen to set the DC component of the voltage of the first differential node. Preferably, the centre tap voltage controller comprises a switch for selectively connecting the centre tap to a third voltage and a fourth voltage to activate the receiver and the transmitter respectively. Such a switch can, for example, be included in an integrated circuit which also includes the transceiver. Integrated circuit switches are well known. The switch is not situated in series with the transmitter or receiver of the transceiver. Therefore, the switch can effect a change from transmit mode to receive mode of the transceiver, and vice versa, without the switch resulting in losses (such as resistive and capacitive losses) in the signal path.

In certain embodiments, the centre tap voltage controller comprises a switch for selectively connecting the centre tap to a third voltage and a fourth voltage to substantially deactivate the transmitter and the receiver respectively.

In certain embodiments, a differential antenna is connected to terminals of the first node. A differential antenna can therefore be used in place of a balun with a single-ended antenna.

In certain embodiments, the DC voltage controller comprises a DC voltage selector for selecting one of a third voltage and a fourth voltage for the DC component to at least one of activate the receiver and the transmitter respectively, and substantially deactivate the transmitter and the receiver respectively.

Preferably, the first voltage is substantially equal to the third voltage. Preferably, the first and third voltages are a first power supply voltage. Therefore, the same voltage (such as a power supply voltage or ground) can be used to activate and/or deactivate the receiver, and it is not necessary to generate a further voltage suitable for activating and/or deactivating the receiver.

Preferably, the second voltage is substantially equal to the fourth voltage. Preferably, the second and fourth voltages are a second power supply voltage. Therefore, the same voltage (such as a power supply voltage or ground) can be used to activate and/or deactivate the transmitter, and it is not necessary to generate a further voltage suitable for activating and/or deactivating the transmitter.

In certain embodiments, the receiver front end comprises a low-noise amplifier (LNA) and a mixer connected in series between the first voltage and the first node. This provides a power saving in that a single bias current can be used to bias transistors in both the LNA and the mixer.

According to a second aspect of embodiments of the invention, there is provided a method of operating a transceiver, wherein the transceiver comprises a receiver, connected between a first voltage and a first node, for processing the received signal, and a transmitter, connected between a second voltage and the first node, for generating the transmitted signal; and the method comprises controlling a DC component of a voltage of the first node to selectively activate at least one of the transmitter and the receiver.

In certain embodiments, the receiver is a differential receiver, the transceiver is a differential transceiver, and the first node is a differential node.

In certain embodiments, controlling a DC component comprises controlling a voltage of a centre tap of at least one of a balun and a differential antenna connected across the first node.

In certain embodiments, the method comprises activating the receiver by selecting a third voltage for the centre tap. Preferably, the third voltage is substantially equal to the first voltage.

In certain embodiments, the method comprises activating the transmitter by selecting a fourth voltage for the centre tap. Preferably, the fourth voltage is substantially equal to the second voltage.

According to a third aspect of embodiments of the invention, there is provided a transceiver including a transmitter, a receiver and a switch for selecting an operation mode from a transmit mode and a receive mode, wherein the transmitter and receiver are continuously connected to a first node.

According to a fourth aspect of embodiments of the invention, there is provided a transceiver comprising: a differential receiver connected between a first voltage and a first differential node; a differential transmitter connected between a second voltage and the first differential node; at least one of a balun and a differential antenna connected across the first differential node; a switch for selectively connecting a centre tap of the at least one of a balun and a differential antenna to the first voltage and the second voltage to at least one of selectively activate the transmitter and the receiver respectively, and selectively substantially deactivate the receiver and the transmitter respectively.

According to a fifth aspect of embodiments of the invention, there is provided a method of controlling an electrical circuit, the electrical circuit being connected between a first voltage and at least one of a balun and a differential antenna, comprising selectively connecting a centre tap of the at least one of the balun and the differential antenna to respective voltages to selectively activate or substantially deactivate the electrical circuit.

In certain embodiments, the method comprises connecting the centre tap to an activation voltage to activate the electrical circuit.

In certain embodiments, the method comprises connecting the centre tap to a deactivation voltage to substantially deactivate the electrical circuit. Preferably, the deactivation voltage is substantially equal to the first voltage. Preferably, the first voltage is a first power supply voltage.

In certain embodiments, selectively connecting the centre tap to respective voltages comprises selectively connecting the centre tap to a first power supply voltage and a second power supply voltage. Therefore, further voltages do not have to be generated to activate and/or deactivate the circuit.

BRIEF DESCRIPTION OF THE DRAWINGS

Embodiments of the invention will now be described, by way of example only, with reference to the accompanying drawings, in which.

Figure 1:
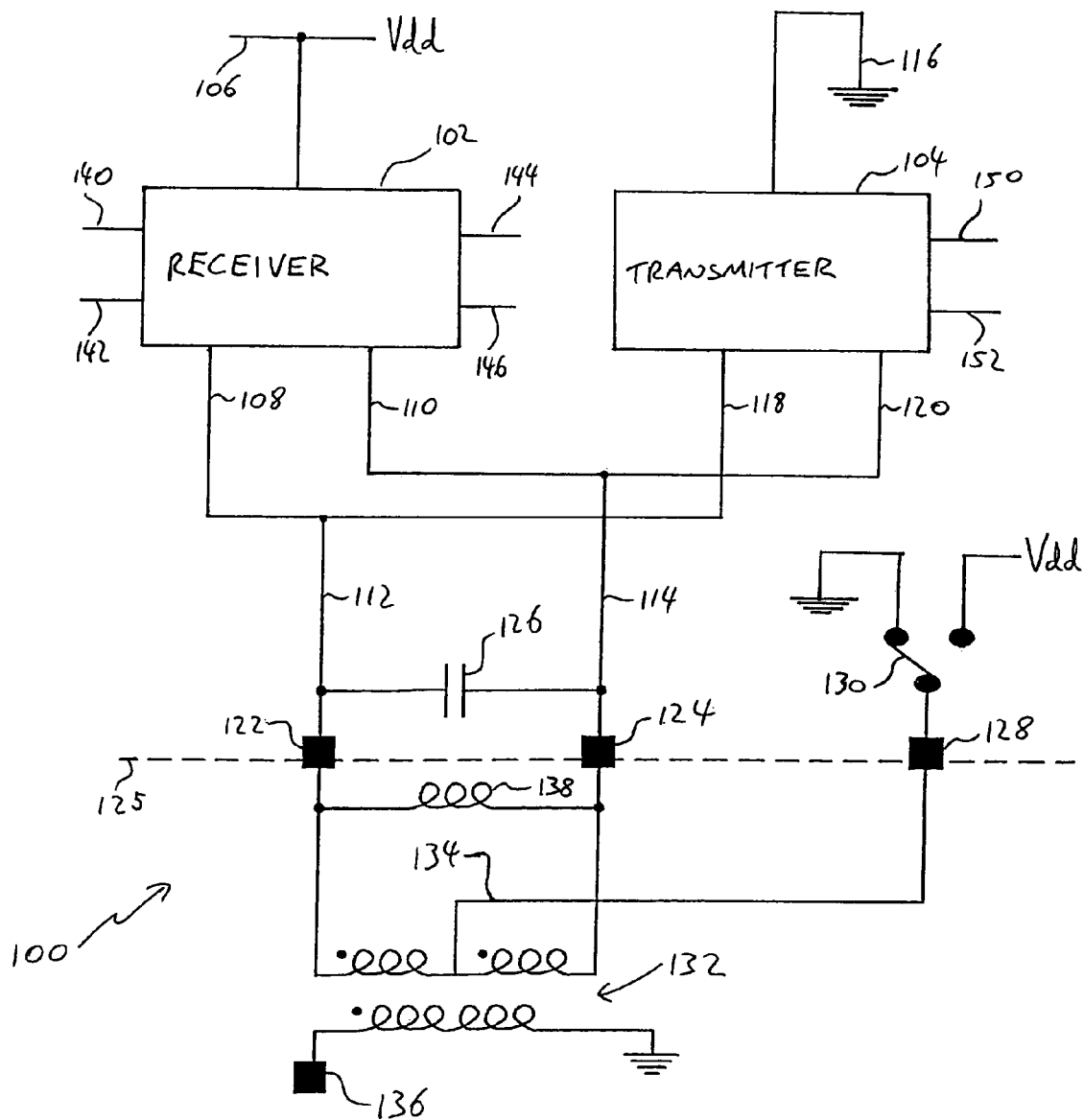
FIG. 1 schematically shows a transceiver according to an embodiment of the invention.

Items that are shown in more than one figure are given consistent reference numerals throughout the figures.

DETAILED DESCRIPTION OF EMBODIMENTS OF THE INVENTION

The transceiver 100 of FIG. 1 includes a differential receiver 102 and a differential transmitter 104.

The receiver 102 is connected to a first power supply rail 106 supplying a voltage Vdd. Differential input lines 108, 110 to the receiver 102 are connected to a first circuit node 112 and a second circuit node 114 respectively. The first 112 and second 114 circuit nodes form a differential node. The receiver 102 is therefore connected between the first power supply rail 106 and the differential node.

The transmitter 104 is connected to a second power supply rail 116 supplying a ground voltage. Differential output lines 118, 120 are connected to the first circuit node 112 and the second circuit node 114 respectively. The transmitter 104 is therefore connected between the second power supply rail 116 and the differential node.

The transceiver 100 either transmits or receives at any given time, and does not transmit and receive simultaneously. Consequently, when the transceiver 100 is transmitting it is said to be in transmit mode, and when the transceiver 100 is receiving and processing the received signal, the transceiver 100 is said to be in receive mode.

The receiver 102 and transmitter 104 are included on an integrated circuit, which is itself mounted within a chip package. The chip boundary 125 is illustrated in FIG. 1. Components located above the chip boundary 125 as shown in FIG. 1 are included on the integrated circuit within the chip package. Components located below the chip boundary 125 are located elsewhere from the integrated circuit, and outside of the chip package (off-chip). Off-chip components may be included in other chips, may be discrete components, or may be other types of components. In alternative embodiments, the components indicated as being off-chip may be implemented instead as on-chip components, such as, for example, on the same integrated circuit as the receiver 102 and transmitter 104.

The position of any of the components in FIG. 1, whether on-chip or off-chip, is exemplary and in other embodiments, any component may be located on-chip or off-chip as appropriate.

The first and second circuit nodes 112, 114 are connected to chip input/output pins 122 and 124 respectively. An on-chip capacitor 126 is connected between the first and second circuit nodes 112, 114.

A third input/output pin 128 of the chip is connected to a switch 130. The switch 130 is controlled by control means (not shown) to connect the pin 128 to either the first power supply rail or the second power supply rail, i.e. to Vdd or ground respectively.

A first winding of a 2:1 balun 132 is connected across the first and second circuit nodes 112, 114 by connecting the winding to the first and second output pins 122, 124. A centre tap 134 of the first winding is connected to the third pin 128.

A second winding of the balun 132 is connected between a third circuit node 136 and ground. The third circuit node is connected to an antenna (not shown).

The balun 132 converts a received signal from a single ended (unbalanced) signal (from the antenna) to a balanced signal, which is provided to the circuit nodes 112 and 114. Also, the balun converts a signal to be transmitted (if any) from a balanced signal on circuit nodes 112 and 114 to a single-ended signal, which is provided to the antenna for transmission.

An external inductor 138 is connected between the output pins 122 and 124. The capacitor 126 and inductor 138 are chosen to resonate at the frequency of interest, i.e. the frequency of a transmitted signal and/or a received signal of interest. Such a frequency of interest may be, for example, a frequency used within the IEEE 802.15.4 communication system, with which embodiments of the invention are suitable for use.

Due to a possible difference in total parasitic capacitance between the receiver 102 and the transmitter 104, the capacitor 126 is made of a suitable size so that the parasitic capacitances of the transistors in the receiver 102 and the transmitter 104 are insignificant in comparison. This ensures that the capacitance, and hence the resonant frequency, does not change significantly when switching from transmit mode to receive mode, and vice versa. Furthermore, a large capacitor 126 allows a smaller, and hence more practical, inductor 138 to be used. In certain embodiments, the inductor is not used and the inductance is provided by the balun 132 (or differential antenna, if used).

The receiver 102 includes a pair of differential local oscillator (LO) input terminals, LO+ 140 and LO− 142. The receiver 102 also includes a pair of differential intermediate frequency (IF) output terminals, IF+ 144 and IF− 146. The transmitter includes a pair of differential radio frequency (RF) input terminals, RF+ 150 and RF− 152.

The operation of the transceiver 100 will now be described. When the transceiver is in receive mode, the switch 130 is controlled to connect the centre tap 134 of the balun 132 to ground. The transmitter 104 is then connected between two ground connections. There is therefore no DC bias path for the transistors of the transmitter 104, and hence the transistors are inactive. Hence, no signal is provided by the transmitter 104 to the circuit nodes 118 and 120, even if a signal is being supplied to the input RF terminals 150 and 152 of the transmitter 104. The transmitter 104 is therefore deactivated or substantially deactivated.

The receiver 102, on the other hand, is connected between two substantially different voltages, which are Vdd provided by the power rail 106 and a ground connection at the centre tap 134 of the balun 132. There is therefore a DC bias path for the transistors within the receiver 102, and therefore the transistors are operational. The receiver 102 is therefore activated when the transceiver 100 is in receive mode. The receiver mixes the received signal on circuit nodes 108 and 110 with respective local oscillator signals 140 and 142 to form the differential intermediate frequency outputs 144 and 146. In alternative embodiments, the local oscillator signal may match the received signal carrier frequency, in which case the receiver 102 would output a baseband signal.

When the transceiver is in transmit mode, the switch 130 is controlled to connect the centre tap 134 of the balun 132 to the first power supply voltage Vdd. The receiver 102 is then connected between two ground connections. There is therefore no DC bias path for the transistors of the receiver 102, and hence the transistors are inactive. The receiver therefore does not output an IF signal on outputs 144 and 146. The receiver is therefore deactivated or substantially deactivated.

The transmitter 104, on the other hand, is connected between two substantially different voltages, which are the ground rail 116 and a Vdd voltage connection at the centre tap 134 of the balun 132. There is therefore a DC bias path for the transistors within the transmitter 104, and therefore the transistors are operational. The transmitter 104 is therefore activated when the transceiver 100 is in transmit mode. The transmitter amplifies the differential input signals 150 and 152 and provides a differential signal to be transmitted on the circuit nodes 118 and 120. The signal is then converted to a single-ended signal by the balun 132 and transmitted by the antenna.

In effect, the DC component of the voltages at the circuit nodes 112 and 114 are controlled by the switch 130 by selectively connecting the centre tap 134 of the balun 132 to the Vdd and ground power supply voltages (i.e. to either the Vdd power supply voltage or the ground power supply voltage). This DC component provides a DC bias path for the receiver 102 or the transmitter 104, depending on whether the transceiver 100 is in receive mode or transmit mode.

A switch that is not located in series within the signal path (i.e. not connected in series between the balun 132 and the transmitter 102 and/or receiver 104) can therefore be used to switch a transceiver from transmit mode to receive mode, and vice versa. The switch 130 is also at a virtual earth point, and hence its capacitance does not have a significant effect on circuit operation. The switch 130 can therefore be made large, compared to switches that are in series in the signal path, to reduce its resistance.

Figure 2:
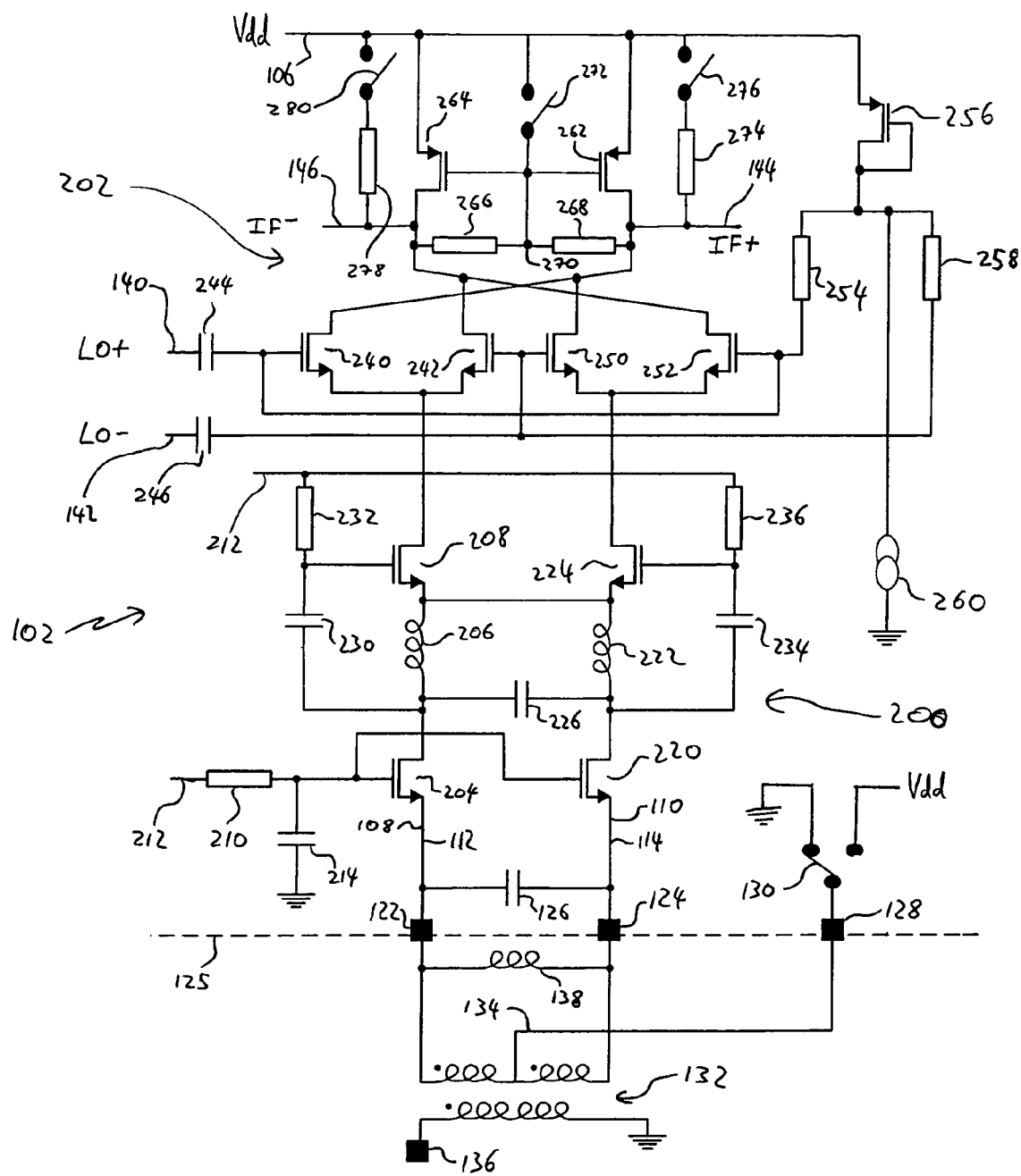
FIG. 2 shows a transceiver receive front end circuit according to an embodiment of the invention.

FIG. 2 shows, in more detail, an example of an embodiment of the transceiver. The transmitter 104 is not shown for clarity.

The receiver 102 comprises a low-noise amplifier (LNA) 200 and a Gilbert cell mixer 202 connected in series between the first power supply rail Vdd 106 and the circuit nodes 108 and 110.

The first circuit node 108 is connected to the source of an n-channel transistor 204. The drain of the transistor 204 is connected via an inductor 206 to the source of a n-channel transistor 208. The gate of the transistor 204 is connected via a resistor 210 to a bias voltage 212, and is also connected via a capacitor 214 to ground.

The second circuit node 110 is connected to the source of an n-channel transistor 220. The drain of the transistor 220 is connected via a second inductor 222 to the source of a n-channel transistor 224. The gate of the transistor 220 is connected to the gate of the transistor 204.

The source of the transistor 208 is connected to the source of the transistor 224. A capacitor 226 is connected between the drain of the transistor 204 and the drain of the transistor 220. The capacitor 226 and inductors 206 and 222 are chosen to resonate substantially at a frequency of interest, i.e. the frequency of the carrier of a received signal of interest. The capacitor 226 and inductors 206 and 222 form an amplifying load for the low-noise amplifier of the receiver 102.

The gate of the transistor 208 is connected via a capacitor 230 to the drain of the transistor 204, and is also connected via a resistor 232 to the bias voltage 212. Similarly, the gate of the transistor 224 is connected via a capacitor 234 to the drain of the transistor 220, and is also connected via a resistor 236 to the bias voltage 212.

The drain of the transistor 208 is connected to the sources of two n-channel transistors 240 and 242. The gate of the transistor 240 is connected via a capacitor 244 to the LO+ input 140. The gate of the transistor 242 is connected via a capacitor 246 to the LO− input 142.

The drain of the transistor 224 is connected to the sources of two n-channel transistors 250 and 252. The gate of the transistor 250 is connected to the gate of the transistor 242. The gate of the transistor 252 is connected to the gate of the transistor 240.

The gates of the transistors 240 and 252 are also connected via a resistor 254 to the drain of a p-channel transistor 256. Similarly, the gates of the transistors 242 and 250 are connected via a resistor 258 to the drain of the transistor 256. The gate and drain of the transistor 256 are connected together. The source of the transistor 256 is connected to the Vdd power supply rail 106. A current source 260 provides a bias current through the transistor 256.

The drains of the transistors 240 and 250 are connected to the drain of a p-channel transistor 262. This node forms the IF+ output 144 of the receiver 102. The drains of the transistors 242 and 252 are connected to the drain of a p-channel transistor 264. This node forms the IF− output 146 of the receiver 102. The drains of the transistors 262 and 264 are connected together by a pair of series resistors 266 and 268. The gates of the transistors 262 and 264 are connected to a mid-point 270 of the pair of resistors 266 and 268.

The gates of the transistors 262 and 264 are also connected via a switch 272 to the Vdd power supply rail 106.

The drain of transistor 262 is connected via a series resistor 274 and switch 276 to the Vdd power supply rail 106. Similarly, the drain of transistor 262 is connected via a series resistor 278 and switch 280 to the Vdd power supply rail 106.

Thus the LNA and Gilbert cell mixer are connected in series between the power supply rail 106 and the circuit nodes 112 and 114. The switches 272, 276 and 280 can be used to select a high or low output impedance for the IF+ and IF− outputs 144 and 146, depending on whether the following circuitry (for example, a filter) accepts a voltage or current drive. To select a high impedance, the switches 276 and 280 are closed, and the switch 272 is open. To select a low impedance, the switches 276 and 280 are open, and the switch 272 is closed.

The switches 276 and 280 are located in the signal path of the receiver 102. However, in normal operation of the receiver 102, these switches, along with switch 272, are static and do not switch, as the following circuitry does not change. Switches 276 and 280 can therefore be made to have a low "on" resistance without significantly distorting the signal, as only low (IF) frequencies need to pass.

The series or "stacked" configuration of the LNA and mixer allows current bias to be shared between the LNA and the mixer. The receiver 102 may therefore consume lower power than a receiver which does not have a LNA and mixer connected in series, as the LNA and mixer would require individual bias currents.

Figure 3:
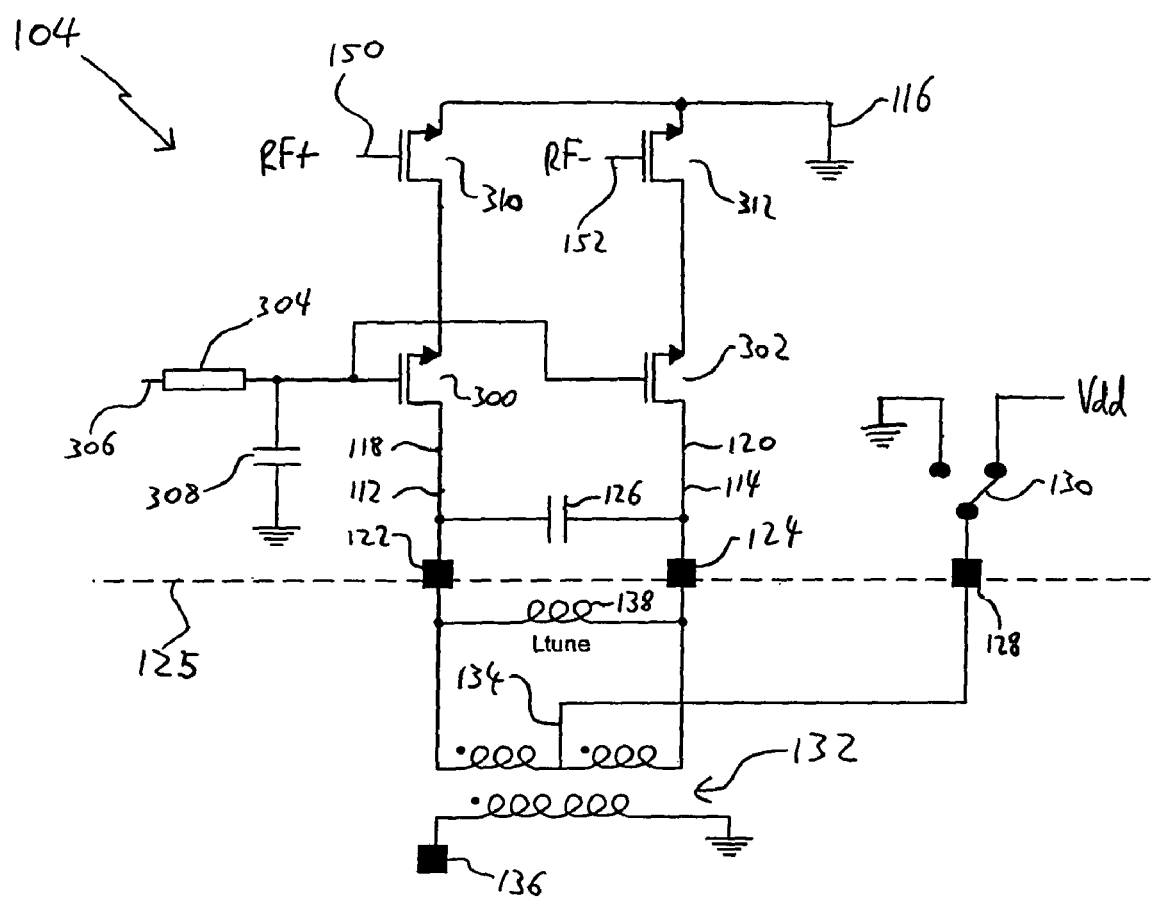
FIG. 3 shows a transceiver transmitter front end circuit according to embodiments of the invention.

FIG. 3 shows an example of an embodiment of the transceiver. The receiver 102 is not shown for clarity. The switch 130 is controlled to connect the centre tap 134 of the balun 132 to the voltage supply rail Vdd.

The circuit node 118 is connected to the drain of an n-channel transistor 300. Similarly, the circuit node 120 is connected to the drain of an n-channel transistor 302. The gates of the transistors 300 and 302 are connected via a resistor 304 to a bias voltage 306, and are also connected via a capacitor 308 to ground.

The source of the transistor 300 is connected to the drain of an n-channel transistor 310. Similarly, the source of the transistor 302 is connected to the drain of an n-channel transistor 312. The sources of the transistors 310 and 312 are connected to the ground voltage supply rail 116.

The gate of the transistor 310 is connected to the RF+ input terminal 150. The gate of the transistor 312 is connected to the RF− input terminal.

In operation, the transmitter 104 amplifies the differential signal supplied on RF+ and RF− input terminals 150 and 152, and supplies the differential signal to the balun 132. The balun 132 converts the differential signal to a single-ended signal and supplies it to the antenna (not shown) for transmission.

Figure 4:
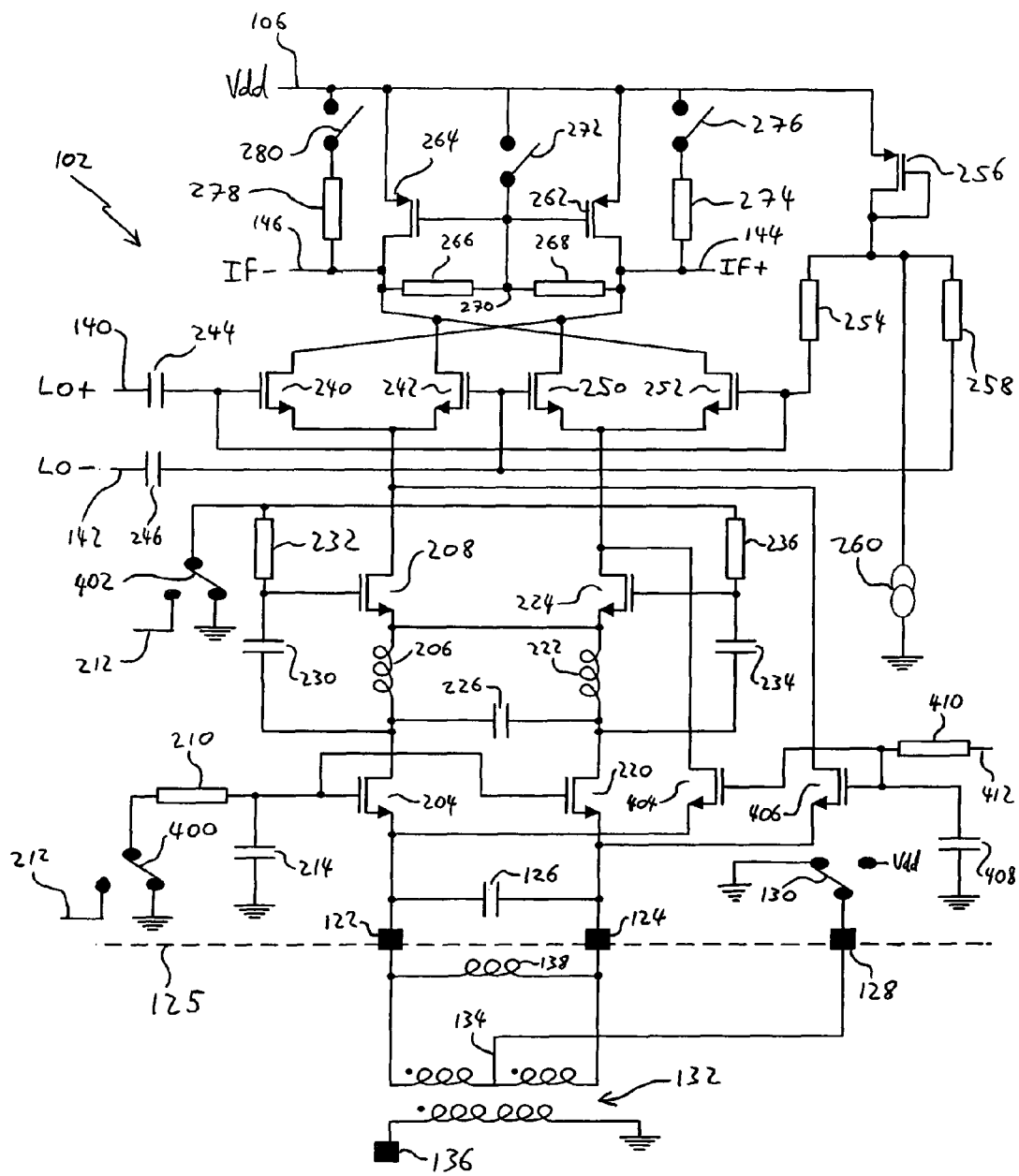
FIG. 4 shows a transceiver receive front end circuit with automatic gain control (AGC) according to alternative an embodiment of the invention.

FIG. 4 shows an alternative embodiment of the receiver of the transceiver. The transmitter 104 is not shown for clarity.

The receiver 102 includes gain control. In certain circumstances, such as, for example, when there is a strong received signal, it is desirable to reduce the gain of the receiver 102. This may improve the linearity of the receiver.

The receiver 102 of FIG. 4 differs from the receiver of FIG. 2 in the following ways. The gates of transistors 204 and 220 are connected via the capacitor 214 to ground, and also via the resistor 210 to a switch 400. The switch 400 connects the resistor 210 to either the bias voltage 212 or ground.

The gate of the transistor 208 is connected via the capacitor 230 to the drain of the transistor 204, and also via the resistor 232 to a switch 402. The gate of the transistor 224 is connected via the capacitor 234 to the drain of the transistor 220, and also via the resistor 236 to the switch 402. The switch 402 connects the resistors 232 and 236 to the bias voltage 212 or ground.

The source of an n-channel transistor 404 is connected to the source of the transistor 204. The drain of the transistor 404 is connected to the drain of the transistor 224. The source of an n-channel transistor 406 is connected to the source of the transistor 220. The drain of the transistor 406 is connected to the drain of the transistor 208.

The gates of the transistors 404 and 406 are connected via a capacitor 408 to ground, and also via a resistor 410 to a bias voltage node 412.

When low gain is desired, the switches 400 and 402 connect the respective resistors 210 and 410 to ground, and a bias voltage is provided to the bias voltage node 412. This causes the received signal to bypass the LNA, and, optionally, the received signal is also attenuated.

When high gain is desired, the switches 400 and 402 connect the respective resistors to the bias voltage 212, and the bias voltage node 412 is connected to ground. The operation of the receiver of FIG. 4 is then substantially identical to the receiver of FIG. 2.

An example embodiment of the invention uses a 200 Ω 2:1 balun, which are readily available and can interface with a 50Ω antenna. The load resistance of the receiver (the resistance between the pins 122 and 124 when the transceiver is in receive mode) is chosen to be substantially 200Ω to maximise power transfer from the balun to the receiver. Alternatively, a 200Ω differential antenna with a centre tap is used. The load resistance of the receiver can be chosen by selecting the size of the transistors in the receiver (such as, for example, the transistors 204 and 220, and the transistors 404 and 406) and the bias current appropriately.

Figure 5:
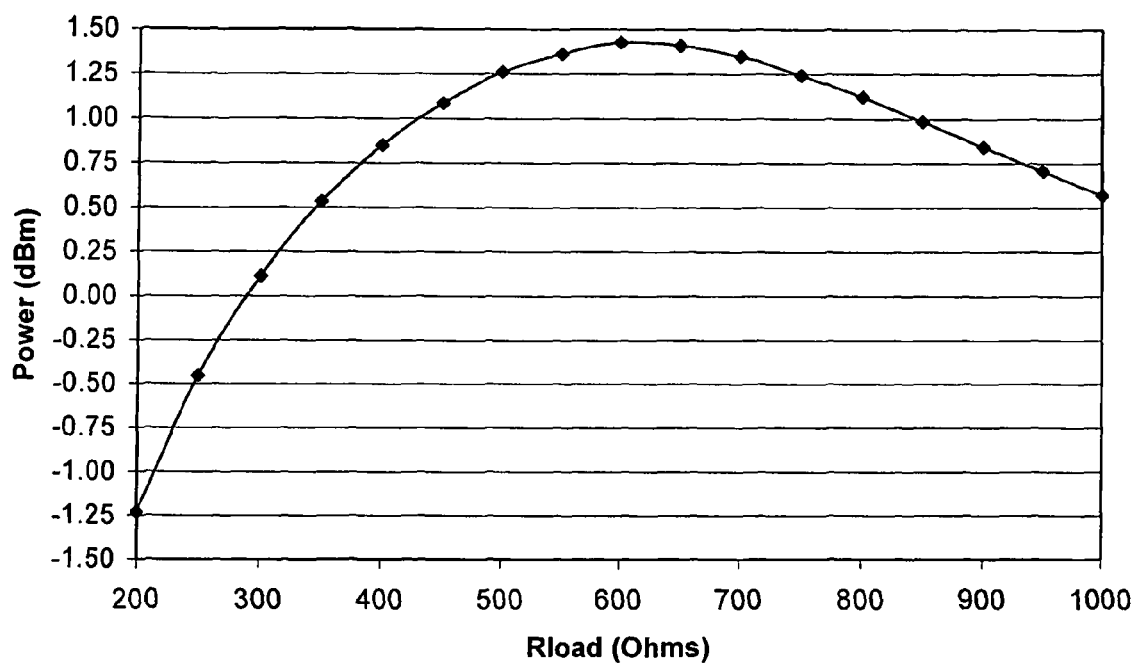
FIG. 5 shows a graph of output power of the transmitter against load resistance of the transmitter.

FIG. 5 shows a graph 500 of output power against the load resistance (the balun resistance, RLoad) when the transceiver is in transmit mode. The maximum power transfer from the transmitter to the load occurs at a load resistance of around 600Ω. However, at certain frequencies of operation such as, for example, a signal carrier frequency of 2.4 GHz, this is an undesirably large impedance. Instead, a 200Ω balun (or 200Ω differential antenna) is used. This provides a lower impedance at the expense of lower power transfer. In certain applications, a 600Ω load resistance may be acceptable, particularly in applications where the operating frequency is lower than 2.4 GHz.

The transceiver is not limited to the receiver 102 being connected to the Vdd power supply rail 106 and the transmitter 104 being connected to the ground voltage supply rail 116. In alternative embodiments to that shown in FIG. 1, for example, the receiver 102 is connected to the ground voltage supply rail 116, and the transmitter 104 is connected to the Vdd voltage supply rail 106. Thus, when the switch 130 connects the centre tap 134 of the balun 132 to Vdd, the receiver 102 is activated and the transmitter 104 is deactivated or substantially deactivated, and the transceiver 100 is in receive mode. Also, when the switch 130 connects the centre tap 134 of the balun 132 to ground, the transmitter 104 is activated and the receiver 102 is deactivated or substantially deactivated, and the transceiver 100 is in transmit mode.

In such alternative embodiments, embodiments of the receiver 102 may include circuits that are similar to those shown in FIGS. 2 and 4. The p-channel transistors are replaced by n-channel transistors, the n-channel transistors are replaced by p-channel resistors, and the bias voltages and currents are chosen and connected appropriately. The resulting circuit (not shown) is an "upside-down" circuit which is activated when the centre tap 134 of the balun 132 is connected to Vdd. Similarly, embodiments of the transmitter 104 may include circuits similar to that shown in FIG. 3, modified as appropriate.

In certain embodiments, the voltages provided to the receiver 102 and transmitter 104 as power supply voltages are not identical to the voltages connected to the centre tap 134 of the balun 132 by the switch 130. To deactivate or substantially deactivate the receiver 102 or the transmitter 104, the switch 130 connects the centre tap 134 to a voltage which is close to the respective power supply voltage. For example, if the receiver 102 is connected to the Vdd power supply rail 106 as shown in FIG. 1, to deactivate or substantially deactivate the receiver 102, the switch 130 connects the centre tap 134 to a voltage close to the Vdd power supply voltage. Thus, even though the receiver 102 is effectively connected between voltages that give a small voltage difference, the difference is not large enough for the receiver 102 to become active or substantially active, and the receiver 102 draws little or no power. Similarly, to deactivate the transmitter 104, the switch 130 connects the centre tap 134 to a voltage close to the power supply voltage of the transmitter 104 (for example, a voltage close to ground for the transmitter connected as shown in FIG. 1). Thus, the transmitter provides little or no output on the circuit nodes 118 and 120, and circuit operation (for example, operation of the receiver 102) is not substantially affected, as the transmitter provides little or no signals on the circuit nodes 118, 120 and hence circuit nodes 108 and 110.

The Vdd power supply voltage is chosen, in certain embodiments, to be 1.8V.

In alternative embodiments, in transmit mode, the receiver may not be deactivated or substantially deactivated. Instead, the receiver may be activated, and the outputs from the receiver (for example, outputs 144 and 146) simply ignored. However, this may lead to increased power consumption when in transmit mode compared to an embodiment where the receiver is deactivated or substantially deactivated.

Embodiments of the transceiver described herein may be used with many communications protocols, and can therefore be used in communications devices that make use of such protocols. One example of a communications protocol with which embodiments of the invention are suitable is IEEE 802.15.4.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The invention claimed is:

1. A transceiver comprising:
 a first differential node for receiving a received signal and transmitting a transmitted signal;
 a differential receiver, connected between a first voltage and the first node, for processing the received signal;
 a differential transmitter, connected between a second voltage and the first node, for generating the transmitted signal;
 a balun connected across the first node; and
 a DC voltage controller comprising a centre tap voltage controller for selecting a centre tap voltage for a centre tap of the balun for at least one of: selectively activating at least one of the transmitter and the receiver; and selectively substantially deactivating at least one of the transmitter and receiver.

2. A transceiver as claimed in claim 1, wherein the centre tap voltage controller comprises a switch for selectively connecting the centre tap to a third voltage and a fourth voltage to activate the receiver and the transmitter respectively.

3. A transceiver as claimed in claim 1, wherein the centre tap voltage controller comprises a switch for selectively connecting the centre tap to a third voltage and a fourth voltage to substantially deactivate the transmitter and the receiver respectively.

4. A transceiver as claimed in claim 1, comprising a differential antenna connected to terminals of the first node.

5. A transceiver as claimed in claim 4, wherein the DC voltage controller comprises a centre tap voltage controller for selecting a centre tap voltage for a centre tap of the differential antenna.

6. A transceiver as claimed in claim 5, wherein the centre tap voltage controller comprises a switch for selectively connecting the centre tap to a third voltage and a fourth voltage to activate the receiver and the transmitter respectively.

7. A transceiver as claimed in claim 5, wherein the centre tap voltage controller comprises a switch for selectively connecting the centre tap to a third voltage and a fourth voltage to substantially deactivate the transmitter and the receiver respectively.

8. A transceiver as claimed in claim 1, wherein the DC voltage controller comprises a DC voltage selector for selecting one of a third voltage and a fourth voltage for the DC component to at least one of activate the receiver and the transmitter respectively, and substantially deactivate the transmitter and the receiver respectively.

9. A transceiver as claimed in claim 8, wherein the first voltage is substantially equal to the third voltage.

10. A transceiver as claimed in claim 8, wherein the second voltage is substantially equal to the fourth voltage.

11. A transceiver as claimed in claim 1, wherein one of the first voltage and the second voltage is a power supply voltage, and the other of the first voltage and the second voltage is a ground voltage.

12. A transceiver as claimed in claim 1, wherein the receiver comprises a low noise amplifier (LNA).

13. A transceiver as claimed in claim 1, wherein the receiver comprises a mixer such as, for example, a Gilbert cell mixer.

14. A transceiver as claimed in claim 1, wherein the receiver comprises a low noise amplifier (LNA) and a mixer such as, for example, a Gilbert cell mixer.

15. A transceiver as claimed in claim 14, wherein the LNA and the mixer are connected in series between the first voltage and the first node.

16. A method of operating a transceiver, wherein the transceiver comprises a differential receiver, connected between a first voltage and a first differential node, for processing the received signal, and a differential transmitter, connected between a second voltage and the first node, for generating the transmitted signal; and the method comprises controlling a DC component of a voltage of the first node to selectively activate at least one of the transmitter and the receiver, wherein controlling a DC component comprises controlling a voltage of a centre tap of at least one of a balun and a differential antenna connected across the first node.

17. A method as claimed in claim 16, comprising activating the receiver by selecting a third voltage for the centre tap.

18. A method as claimed in claim 16, wherein the third voltage is substantially equal to the first voltage.

19. A method as claimed in claim 16, comprising activating the transmitter by selecting a fourth voltage for the centre tap.

20. A method as claimed in claim 19, wherein the fourth voltage is substantially equal to the second voltage.

* * * * *